United States Patent
Yateem et al.

(10) Patent No.: US 10,606,967 B2
(45) Date of Patent: Mar. 31, 2020

(54) EVALUATING WELL STIMULATION TO INCREASE HYDROCARBON PRODUCTION

(71) Applicants: SAUDI ARABIAN OIL COMPANY, Dhahran (SA); Schlumberger Technology Corporation, Sugar Land, TX (US)

(72) Inventors: Karam Yateem, Tanajib (SA); Ramy Ahmed, Dammam (SA); Mubarak Dhufairi, Tanajib (SA); Saleh Al-Ghamdi, Tanajib (SA)

(73) Assignees: Saudi Arabian Oil Company, Dhahran (SA); Schlumberger Technology Corporation, Sugar Land, TX (US)

( * ) Notice: Subject to any disclaimer, the term of this patent is extended or adjusted under 35 U.S.C. 154(b) by 346 days.

(21) Appl. No.: 15/584,790

(22) Filed: May 2, 2017

(65) Prior Publication Data
US 2018/0322227 A1 Nov. 8, 2018

(51) Int. Cl.
*E21B 41/00* (2006.01)
*G06F 17/50* (2006.01)
(Continued)

(52) U.S. Cl.
CPC ...... *G06F 17/5009* (2013.01); *E21B 41/0092* (2013.01); *E21B 47/065* (2013.01);
(Continued)

(58) Field of Classification Search
CPC .............. G06F 17/5009; E21B 47/065; E21B 47/1015; E21B 41/0092; E21B 49/00; E21B 43/25; G01V 9/00
See application file for complete search history.

(56) References Cited

U.S. PATENT DOCUMENTS

| 7,062,420 B2 * | 6/2006 | Poe, Jr. .............. E21B 43/00 703/10 |
| 7,561,998 B2 | 7/2009 | Panga et al. |

(Continued)

FOREIGN PATENT DOCUMENTS

| WO | 2006010875 | 2/2006 |
| WO | 2009114508 | 9/2009 |

OTHER PUBLICATIONS

Balto et al., "The Use of Real Time Downhole Pressure and Distributed Temperature Surveying in Quantifying the Skin Evolution and Zone Coverage in Horizontal Well Stimulation," Journal of Petroleum Technology, Oct. 8, 2012, 8 pages.
(Continued)

*Primary Examiner* — Mohamed Charioui
*Assistant Examiner* — Eyob Hagos
(74) *Attorney, Agent, or Firm* — Fish & Richardson P.C.

(57) ABSTRACT

Actual distributed temperature sensing (DTS) data and pressure data are received in response to a stimulation treatment applied to a hydrocarbon field. A pre-stimulation model is built that includes reservoir parameters, which generates simulated DTS and pressure data as a function of the reservoir parameters that include a permeability parameter and a skin parameter. In response to determining that a thermal match between the actual DTS and pressure data and the simulated DTS and pressure data is not obtained, the reservoir parameters are updated. In response to determining that the updated reservoir parameters do not match a performed pressure transient analysis (PTA), the reservoir parameters and the pre-stimulation model are updated, and the simulated DTS and pressure data are re-generated based on the updated pre-stimulation model.

20 Claims, 7 Drawing Sheets

(51) Int. Cl.
*E21B 47/10* (2012.01)
*E21B 47/06* (2012.01)
*G01V 9/00* (2006.01)
*E21B 43/25* (2006.01)
*E21B 49/00* (2006.01)

(52) U.S. Cl.
CPC .......... *E21B 47/1015* (2013.01); *E21B 43/25* (2013.01); *E21B 49/00* (2013.01); *G01V 9/00* (2013.01)

(56) References Cited

U.S. PATENT DOCUMENTS

| | | | |
|---|---|---|---|
| 7,603,261 B2 | 10/2009 | Tardy | |
| 8,849,639 B2* | 9/2014 | Brown | E21B 49/00 703/10 |
| 9,176,245 B2* | 11/2015 | Craig | G01V 1/282 |
| 9,732,592 B2* | 8/2017 | Carvajal | E21B 41/00 |
| 2002/0120429 A1 | 8/2002 | Ortoleva | |
| 2009/0216456 A1* | 8/2009 | Poe, Jr. | E21B 47/065 702/11 |
| 2011/0288843 A1* | 11/2011 | Weng | E21B 47/1005 703/10 |
| 2013/0073272 A1* | 3/2013 | Wallace | E21B 43/00 703/10 |
| 2014/0182841 A1* | 7/2014 | Lecerf | E21B 43/25 166/250.01 |
| 2014/0212006 A1* | 7/2014 | Zhao | G06T 7/0004 382/109 |
| 2014/0350859 A1 | 11/2014 | Lin et al. | |
| 2014/0358510 A1* | 12/2014 | Sarkar | E21B 43/26 703/10 |
| 2015/0024976 A1 | 1/2015 | Albrighton et al. | |
| 2015/0066461 A1* | 3/2015 | Kacewicz | G01V 99/005 703/10 |
| 2016/0356125 A1* | 12/2016 | Bello | G06Q 10/04 |

OTHER PUBLICATIONS

Ahmed et al., "Pushing the Limits of Distributed Temperature Survey Analysis in Mega-Reach Power Water Injectors," Society of Petroleum Engineers, SPE, Nov. 10, 2014, 8 pages.

Arukhe et al., "Saudi Arabia's Manifa Giant Offshore Field Development: The Role of Technology," Society of Petroleum Engineers, SPE, Jan. 1, 2014, 17 pages.

Duru et al., "Combined Temperature and Pressure Data Interpretation: Applications to Characterization of Near-Wellbore Reservoir Structures," SPE Annual Technical Conference, Oct. 30-Nov. 2, 2011, 18 pages.

Goh et al., "IPTC 14274 Application of Permanent Reservoir Monitoring Data (DTS* & PDG*) in a Mature Offshore Malaysian Oilfield, for Production Optimisation and Workover Control," International Petroleum Technology Conference (IPTC), Feb. 7, 2012, 12 pages.

International Search Report and Written Opinion issued in International Application No. PCT/US2018/030236 dated Sep. 7, 2018, 18 pages.

Gulf-Cooperation Council Examination Report issued in GCC Application No. 2018-35236 on Nov. 13, 2019, 4 pages.

* cited by examiner

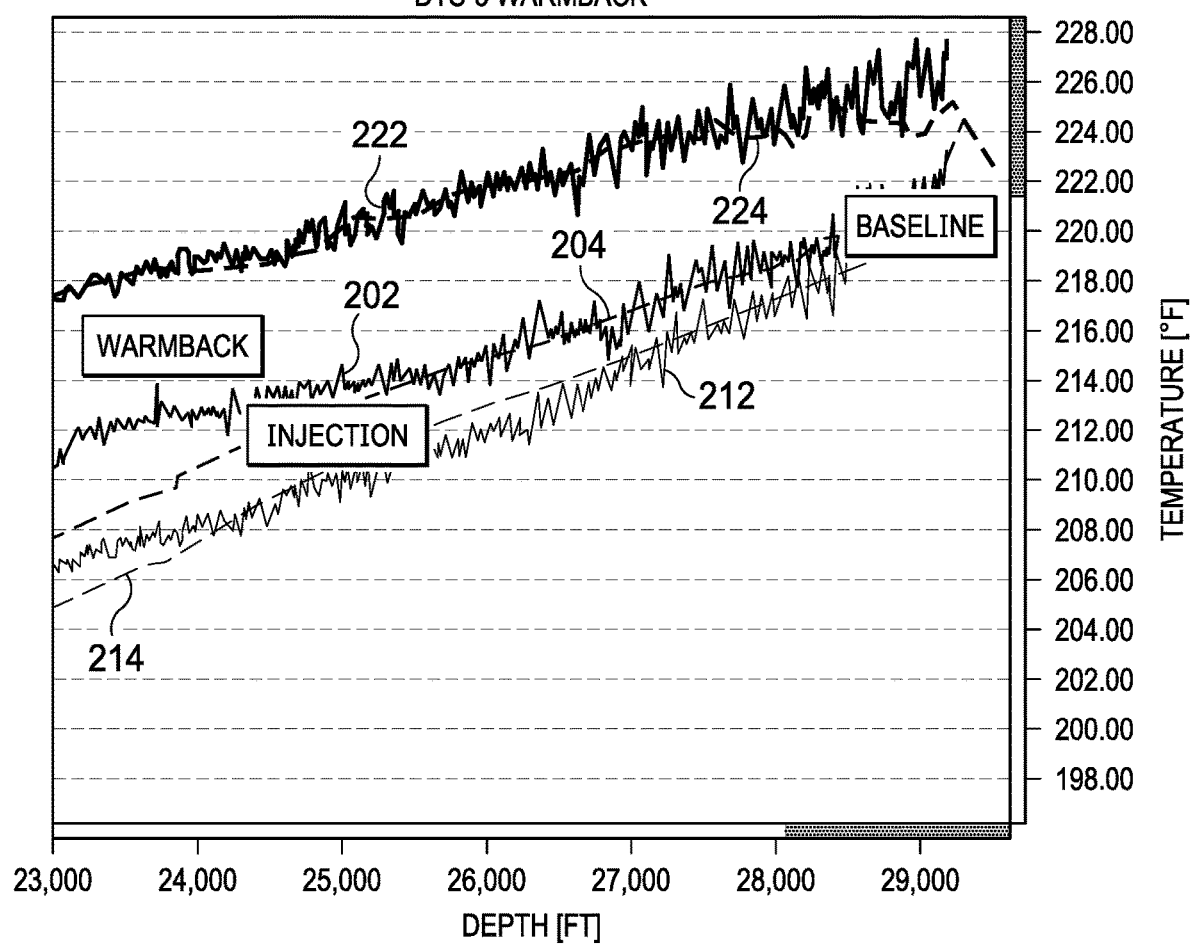

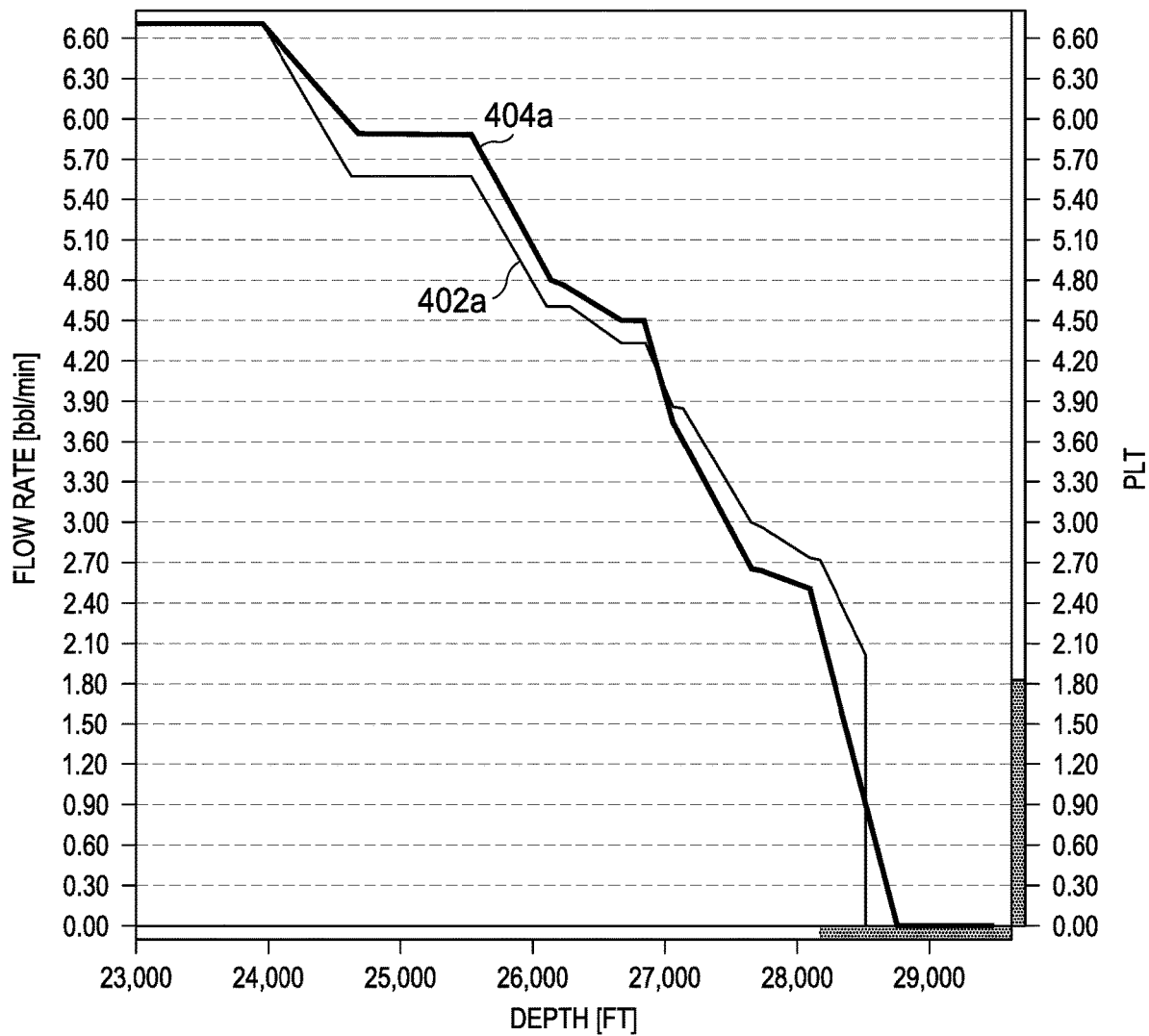

TEMPERATURE ALONG THE CENTRAL FLUID
COLUMN FOR THE DIFFERENT TIME STEPS
— PERM BEFORE
— PERM AFTER

EVALUATING WELL STIMULATION TO INCREASE HYDROCARBON PRODUCTION

BACKGROUND

Increases in well complexity and associated challenges, especially extended reach wells in hydrocarbon fields (for example, carbonate reservoirs), have led to more complicated well stimulation treatments, for example, matrix acidizing, to increase production of hydrocarbons (for example, petroleum and natural gas). Challenges that consistently arise with planned and performed stimulation treatments include, for example, how to qualitatively evaluate near-wellbore horizontal/vertical permeability and zonal coverage of a well section before and after a stimulation treatment.

SUMMARY

The present disclosure describes methods and systems, including computer-implemented methods, computer program products, and computer systems for determining zonal coverage and evaluating designed and performed stimulations of hydrocarbon wells to increase hydrocarbon production.

In an implementation, a computer-implemented method includes receiving actual distributed temperature sensing (DTS) data and pressure data in response to a stimulation treatment applied to a hydrocarbon field through a well in the hydrocarbon field; building a pre-stimulation model that includes reservoir parameters, the pre-stimulation model generating simulated DTS and pressure data as a function of the reservoir parameters, the reservoir parameters including a permeability parameter and a skin parameter of the hydrocarbon field; determining whether a thermal match between the actual DTS and pressure data and the simulated DTS and pressure data is obtained; in response to determining that the thermal match between the actual DTS and pressure data and the simulated DTS and pressure data is not obtained: updating the reservoir parameters including updating the permeability parameter and the skin parameter; updating the pre-stimulation model based on the updated reservoir parameters; and re-generating the simulated DTS and pressure data based on the updated pre-stimulation model until the thermal match between the actual DTS and pressure data and the simulated DTS and pressure data is obtained; determining whether the updated permeability parameter and the updated skin parameter match a performed pressure transient analysis (PTA); and in response to determining that the updated permeability parameter and the updated skin parameter do not match the PTA: updating the reservoir parameters including updating the updated permeability parameter and the updated skin parameter; updating the pre-stimulation model based on the updated reservoir parameters; and re-generating the simulated DTS and pressure data based on the updated pre-stimulation model until the thermal match between the actual DTS and pressure data and the simulated DTS and pressure data is obtained and the updated permeability parameter and the updated skin parameter match the PTA.

Particular implementations of described methods and systems can include corresponding computer systems, apparatuses, or computer programs (or a combination of computer systems, apparatuses, and computer program) recorded on one or more computer storage devices, each configured to perform the actions of the methods. A system of one or more computers can be configured to perform particular operations or actions by virtue of having software, firmware, hardware, or a combination of software, firmware, or hardware installed on the system that in operation causes the system to perform the actions. One or more computer programs can be configured to perform particular operations or actions by virtue of including instructions that, when executed by data processing apparatus, cause the apparatus to perform the actions.

A first aspect, combinable with the general implementation, further includes receiving input well data associated with the stimulation treatment for the hydrocarbon field through the well in the hydrocarbon field; and preparing the stimulation treatment based on input well data, wherein preparing the stimulation treatment of the hydrocarbon field includes one or more of designing a coiled tubing stimulation; testing the well infectivity; monitoring movement of injected fluid in the well; creating a pressure transient event to be analyzed for the permeability parameter and the skin parameter; or monitoring a warmback profile of the hydrocarbon field.

A second aspect, combinable with the general implementation, preparing a stimulation treatment of the hydrocarbon field includes obtaining pre-stimulation DTS data and pressure data associated with the well in the hydrocarbon field, the method further including determining whether the obtained pre-stimulation DTS data and pressure data are sufficient for executing the stimulation treatment; and in response to determining that the obtained pre-stimulation DTS data and pressure data not sufficient for executing the stimulation treatment, obtaining more pre-stimulation DTS and pressure data by creating more events in the preparing the stimulation treatment.

A third aspect, combinable with the general implementation, further includes in response to determining that the obtained pre-stimulation DTS data and pressure data are sufficient for executing the stimulation treatment, performing the stimulation treatment.

A fourth aspect, combinable with the general implementation, performing the stimulation treatment includes one or more of detecting high intake zones of the well based on the pre-stimulation DTS data; optimizing stimulation fluid pumping schedule by adjusting a flow rate to match an actual well condition; or pumping stimulation fluid into the well according to a stimulation fluid pumping schedule.

A fifth aspect, combinable with the general implementation, the input well data includes one or more of a wellbore diagram, directional survey, while-drilling mobility data, processed lithological data or petro-physical logs.

A sixth aspect, combinable with the general implementation, further includes evaluating the stimulation treatment, wherein evaluating the stimulation treatment includes one or more of obtaining actual DTS data while injecting a post-flush fluid into the well; comparing an injection/fall-off of a pre-flush into the well with an injection/fall-off of the post-flush into the well to evaluate chemical diversion and stimulation efficiency; detecting improvements in flow paths or pressure response; or performing a production logging tool (PLT) run.

A seventh aspect, combinable with the general implementation, building a pre-stimulation model includes one or more of applying a change of the reservoir parameters to match a transient event; or building the pre-stimulation model to match a thermal event.

An eighth aspect, combinable with the general implementation, further includes fine-tuning the actual DTS and pressure data and the simulated DTS and pressure data for building the pre-stimulation model.

A ninth aspect, combinable with the general implementation, further includes comparing the reservoir parameters with a result of a production logging tool (PLT) run; or outputting the reservoir parameters.

The above-described implementation is implementable using a computer-implemented method; a non-transitory, computer-readable medium storing computer-readable instructions to perform the computer-implemented method; and a computer-implemented system including a computer memory interoperable coupled with a hardware processor configured to perform the computer-implemented method/the instructions stored on the non-transitory, computer-readable medium.

The details of one or more implementations of the subject matter of this specification are set forth in the accompanying drawings and the description below. Other features, aspects, and advantages of the subject matter will become apparent from the description, the drawings, and the claims.

DESCRIPTION OF DRAWINGS

FIG. 2 is an illustration of an actual vs. simulated injection-warmback distributed temperature sensing or survey (DTS) plot with baseline, according to an implementation.

FIG. 4A is an illustration of an actual vs. simulated production rate plot, according to an implementation.

Like reference numbers and designations in the various drawings indicate like elements.

DETAILED DESCRIPTION

Figure 1A:
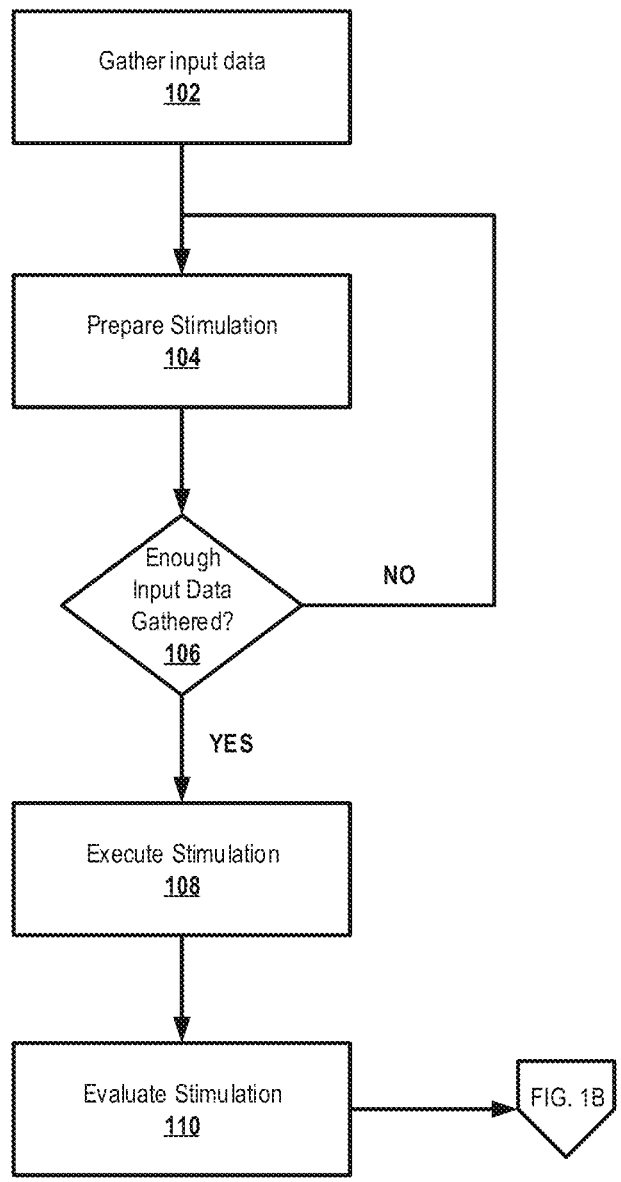
FIGS. 1A and 1B illustrate a flow chart of an example method for determining zonal coverage and evaluating designed and performed stimulations of hydrocarbon wells to increase hydrocarbon production, according to an implementation.

The present detailed description relates to evaluation of hydrocarbon well stimulations to increase hydrocarbon production.

The following subject matter is presented to enable person skilled in the art to make and use the disclosed subject matter in the context of one or more particular implementations. Various modifications, alterations, and permutations of the disclosed implementations can be made and will be readily apparent to those skilled in the art, and the general principles defined may be applied to other implementations and applications without departing from scope of the disclosure. Thus, the present disclosure is not intended to be limited to the described or illustrated implementations, but is to be accorded the widest scope consistent with the principles and features disclosed.

Increases in hydrocarbon well complexity and associated challenges, especially extended reach wells in carbonate reservoirs, have led to more complicated well stimulation treatments, for example, matrix acidizing, to increase production of hydrocarbons. Challenges that consistently arise with planned and performed stimulation treatments include, for example, how to qualitatively evaluate near-wellbore permeability (both horizontal and vertical) and zonal coverage of a hydrocarbon well section both before and after a stimulation treatment.

Stimulation evaluations can be time consuming, especially if a software production logging tool (PLT) or pressure transient tests are to be performed for each hydrocarbon well before and after simulation treatment(s), which result in a delay of hydrocarbon production—effectively lost revenue.

Additionally, it is challenging to quantify a hydrocarbon production improvement per foot in horizontal wells following a stimulation treatment. While effort is spent on modern technologies to qualitatively evaluate zonal coverage and estimate a skin factor evolvement after a stimulation, no work has yet answered how a stimulation (for example, a matrix acidizing treatment) alters near-wellbore permeability and affects zonation of a horizontal wellbore when treating carbonate reservoirs.

In long, horizontal wells that are drilled in carbonate formations, it is believed that wormholing significantly alters near-wellbore apparent permeability. Nevertheless, methods to estimate a change in permeability resulting from a matrix acidizing treatment are not known, and usually the change is accounted for in simulators by assigning a very low skin value. Other work conducted in carbonate reservoirs using pressure transient analysis techniques has shown that applying a change in permeability is necessary to obtain a type-curve match, though assumptions of a lump-sum value are made and the other techniques do not consider a skin per foot (S/ft)-type concept.

In this disclosure, a workflow for evaluating hydrocarbon well stimulations is described. The workflow can be used for effective stimulation of mega-reach wells using a real-time temperature profile. In some implementations, the described workflow can estimate changes in critical matrix rock properties and provide a mechanism to incorporate these estimated changes into future simulations. The workflow integrates, for example, while-drilling mobility data, open-hole porosity logs, pressure-transient data, distributed temperature survey data, production logging data, and the like to verify accuracy of a generated pre-stimulation model by using a flow rate as a control parameter for iterations. In applying the workflow that uses distributed temperature survey (DTS) and pressure-transient analysis (PTA), changes in critical matrix rock properties can be estimated and the estimated changes can be incorporated into further simulation(s) for optimizing operational time and for efficient zonal coverage.

In some implementations, detailed flow characteristics before and after a stimulation are obtained in an inverse type solution similar to well test interpretation. The results can be summarized in a table for comparing profiles before and after the stimulation. Several sensitivity runs can be performed to evaluate the effectiveness of each parameter of flow characteristics.

In some implementations, the described workflow allows a systematic reproduction of consistent results for all water injector wells. The workflow output provides reservoir simulation engineers with additional detailed information about flow characteristics in the critical matrix of the wells. The focus of the workflow is on permeability and skin per section of a horizontal section before and after a stimulation (for example, an acidizing matrix treatment).

In some implementations, the workflow focuses on permeability and skin per section of a horizontal section before and after a stimulation (for example, an acidizing matrix treatment). Application of the workflow can be a function of using coiled tubing (CT) that is fiber-optic-enabled to simultaneously pump and monitor a stimulation treatment. The workflow can receive input such as while-drilling mobility data, basic lithological interpretation prior to start of the workflow, and production logging tool (PLT) data either before or after the stimulation. In some implementations, using both before- and after-stimulation PLT data enhances the described workflow.

In some implementations, the described workflow can be implemented as a simulation model or a simulator. The simulation model can model water injection (for example, assuming incompressible fluid injection). The simulation model can include a transient model that uses both thermal finite difference and steady state pressure calculations to solve for a given transient flow within a predefined thermal time-step of pressure and/or flow. In some implementations, the simulation model can use a Joshi Steady State Model for horizontal flow, so consideration of both vertical and horizontal permeabilities are part of the described workflow methodology.

Figure 1B:
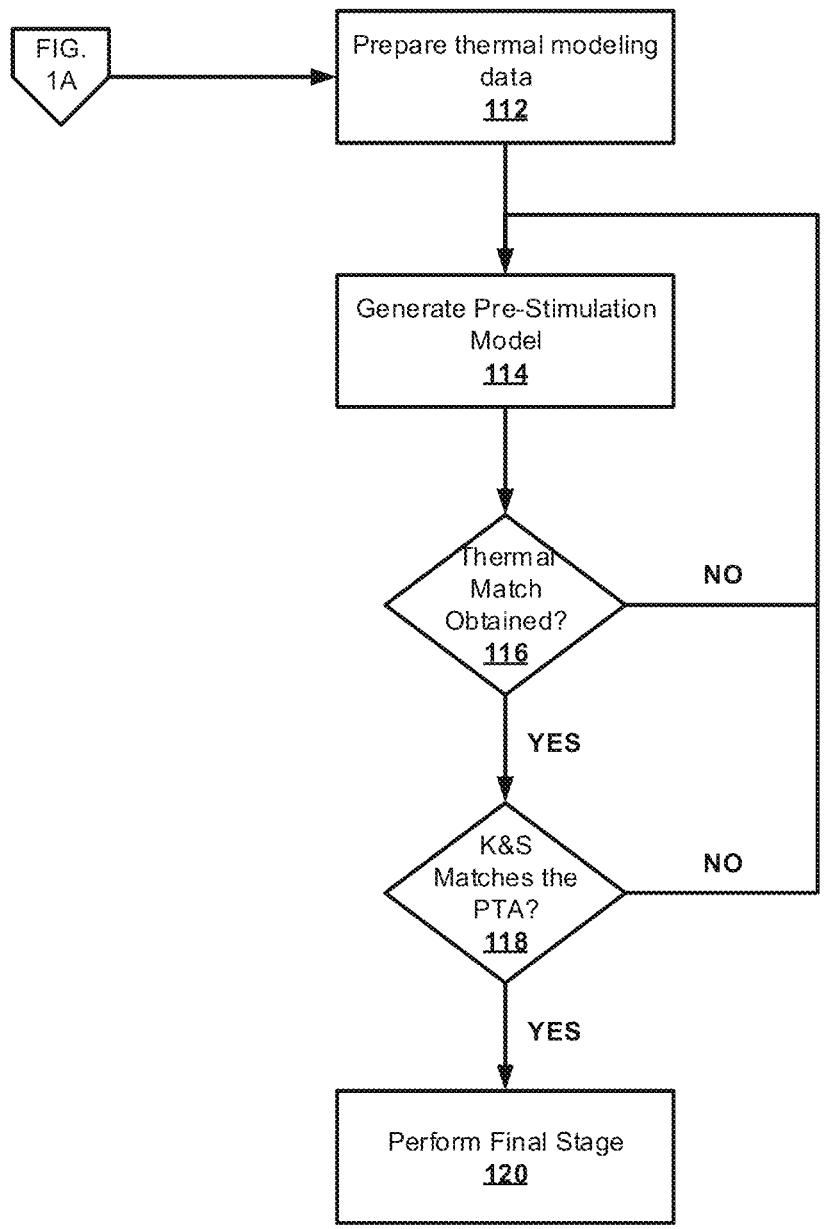

At a high level, FIGS. 1A and 1B show an example workflow for generating a simulation model and calibrating the simulation model with actual data. A simulation model can be used to ensure proper execution of a tailored stimulation program. The simulation model includes a number of sub-models or modules for performing various operations, such as, data gathering, stimulation preparation, stimulation execution, stimulation evaluation, thermal modeling, pre-stimulation modeling and final verification and comparison. The output parameter of the simulation model can include, for example, simulated PLT log. The simulation model generates multiple outputs during and after stimulation execution, while the stimulation pumping schedule can be optimized or otherwise improved based on the ouptuts of the simulation model.

FIG. 1A illustrates a flow chart of an example method 100 for determining zonal coverage and evaluating designed and performed stimulations of hydrocarbon wells (for example, petroleum wells) to increase hydrocarbon production from a hydrocarbon field, according to an implementation. For clarity of presentation, the description that follows (including FIG. 1B) generally describes method 100 in the context of FIGS. 1A-1B, 2-3, 4A & 4B, and 5. However, it will be understood that method 100 may be performed, for example, by any suitable system, environment, software, and hardware, or a combination of systems, environments, software, and hardware as appropriate. In some implementations, various steps of method 100 can be run in parallel, in combination, in loops, and/or in any order.

At 102, input well data is gathered or received. For example, input well data can include a wellbore diagram, directional survey, while-drilling mobility data, and processed lithological data or petro-physical logs. In some implementations, gathering input data can also include obtaining DTS thermal parameters for preparing thermal modeling at 112, and/or obtaining permeability and skin parameters for pre-stimulation building at 114. From 102, method 100 proceeds to 104.

At 104, a stimulation treatment is prepared. In some implementations, preparing the stimulation treatment of the hydrocarbon field include obtaining DTS data and pressure data associated with the well in the hydrocarbon field. The DTS data and pressure data can be referred to as pre-stimulation DTS data and pressure data as they are collected prior to the execution of the stimulation treatment. In some implementations, preparing the stimulation treatment of the hydrocarbon field include, for example, designing a coiled tubing stimulation; testing the well infectivity; monitoring movement of injected fluid in the well; creating a pressure transient event to be analyzed for the permeability parameter and the skin parameter; or monitoring a warmback profile of the hydrocarbon field.

For example, a coil tubing (CT) stimulation treatment can be designed. Designing the CT stimulation can include, for example, designing a tubing force model (TFM) and a bottomhole assembly (BHA) (that is, a tool string at the bottom of the coil), for example, using software (for example, CoilUMIt) that calculates the TFM associated information. Designing the TFM can include calculating or otherwise determining information such as the dragging forces, buoyancy forces and friction forces. Designing the BHA can include determining information such as measurements of pressure gauge, temperature gauge, gamma ray sensor and DTS.

In some implementations, the TFM calculation is performed by calculating the forces along the length of a CT string at a specific depth in a well. The CT stimulation is run in a wellbore hole to total depth (TD) so that a geothermal DTS baseline profile (a geothermal reference) can be obtained for the wellbore/desired wellbore section. For DTS, a fiber optic line is inserted in the coil tubing that measures several parameters such as temperature and pressure on a continuous basis (for example, in real-time fashion) during the operation or as set (for example, prior to the operation and after completion of operation). In some implementations, the DTS baseline profile can be the measurements taken prior to the stimulation treatment or at a previous time instance of a current stimulation treatment.

Note that several actions (for example, attaching a pump to the wellhead, etc.) may take place between 102 and 104. A pre-flush fluid can be bullheaded at a particular rate (typically a maximum allowable rate) for example to test the well injectivity. Pre-flush is a process to clean and prepare the formation for the stimulation job. In some implementations, the pre-flush fluid can include, for example, hydrochloric acid (HCl). The pre-flush fluid can be pumped ahead of the main treating fluid (for example, a mixture of hydrofluoric (HF) and HCl or organic acids) in a sandstone matrix-stimulation treatment.

During the pre-flush, thermal changes occurring in the wellbore are monitored using DTS in the CT annulus. In some implementations, the well injectivity is tested, movement of fluids in the wellbore are monitored, and a pressure transient event is created. A pressure transient event includes two main elements: 1) an injection event (for example, by injecting a fluid with constant flow rate for limited time and 2) a fall-off event (for example, by shutting the pump and measuring the change in pressure response). These two transient element events can be repeated as needed for analyzing K (formation permeability) and S (formation damage skin). The pumps are then shut-in, and warmback profiles (for example, warmback temperature traces) of the hydrocarbon field are obtained. From 104, method 100 proceeds to 106.

At 106, it is determined whether enough pre-stimulation DTS and pressure data have been obtained by the stimulation preparation in 104. In some implementations, the DTS data can include temperature, or any other data that are measured or otherwise obtained during a DTS. In some implementations, whether the DTS and pressure data are enough depends on one of the input parameters (reservoir parameters such as permeability K and skin S) for a pre-stimulation model building at 114. For example, the DTS and pressure data is enough if a thermal match model and K and S match can be achieved based on the DTS and pressure data. Because these two parameters may not be the same for any two different wells, the determination at 106 can be based on case-by-case predetermined simulation studies.

When enough DTS and pressure data are obtained, stabilized temperature and pressure are reached with minimal changes, which can be a critical step in the data acquisition. In this case, method 100 proceeds to 108. If the temperature and pressure have not reached a stabilized condition, the DTS and pressure data are insufficient and more pre-stimulation DTS and pressure data can be obtained. In some implementations, the stimulation preparation can be repeated to help generate additional DTS and pressure data. In some implementations, un-obtained reservoir parameters (that is, not an input) such as section length can be adjusted to obtained additional DTS and pressure data.

At 108, a stimulation treatment is executed or performed. In some implementations, the stimulation treatment is performed by an injection system or another well system that include a computer system that can monitor, control or otherwise manage the execution of the stimulation treatment. For example, using the warmback temperature traces from 104, high intake zones of the wellbore are detected (higher intake into particular wellbore zones (wellbore walls) of pre-flush results in a higher temperature associated with the zone). Given the determined well conditions (for example, high intake zones and DTS or pressure data), stimulation fluid pumping can be optimized by adjusting the flow rate (for example, gal/ft) to match the actual well conditions. Actual well conditions can be monitored in real time by DTS temperature response. In some implementations, in order to match the actual temperature with the temperature from the model, the tuning factor can be a pumping flow rate which can be adjusted from the surface pump during actual operation. Additionally, a decision can be made whether to use a chemical diverter to minimize impact to particular wellbore zones by adjusting the pumping schedule to place the chemical diverter in the particular wellbore zones. From 108, method 108 proceeds to 110.

At 110, the stimulation treatment is evaluated. In some implementations, a post-flush fluid is bullheaded into the wellbore using the CT. For example, the post-flush fluid is bullheaded into the CT-Tubing (TBG) annulus (for example, the area between the utilized CT and the existing well TBG). DTS profiles are acquired while injecting the post-flush fluid until the volume of the wellbore is completed. In some implementations, the injection/fall-off of the pre-flush is compared with the injection/fall-off of the post-flush. For example, warmback temperature traces of the post-flush are monitored and compared with the pre-flush warmback temperature traces. The comparison can be used to evaluate chemical diversion and stimulation efficiency. Qualitative injection velocity and injection rate of the stimulation are determined by comparing slope changes (cooling/temperature fall-off) in the warmback temperature traces from both before and after pumping the stimulation. Using this data, improvements in flow paths or pressure response (or both) can be detected, for example, when matches in certain data (such as the match of thermal modeling and reservoir model) are obtained.

In some implementations, a production logging tool (PLT) run is performed (either in real-time or based on stored data). The PLT run can provide detailed information in association with the production of the well in downhole conditions. For example, PLT can generate a production profile of the well that captures the potential of sections/intervals based upon the well completion structure. PLT can also obtain pressure and temperature information. PLT can help obtain the exact downhole measurement of the well rate potential and classification of what sort of effluent is obtained. For instance, if one of the intervals has a lot of undesirable effluent production (for example, water in the case of an oil well), measures can be taken to shut-off those water producing intervals/sections. The PLT run can be performed before stimulation or after stimulation, or even both if required. From 110, method 100 proceeds to 112.

Turning to FIG. 1B, FIG. 1B is a continuation of illustrated flow chart of FIG. 1A of an example method 100 for determining zonal coverage and evaluating designed and performed stimulations of hydrocarbon wells to increase hydrocarbon production, according to an implementation.

At 112, thermal modeling data is prepared, for example, by further modifying the previously acquired well data in terms of computational algorithm adoption, simulation, and putting data in the rightful format (for example, rates as a format for PLT). For example, the acquired well data can be fine-tuned or otherwise adjusted so that the difference between actual data versus simulated data is within a specified range of accuracy. The preparation can include preparing the previously acquired well data from FIG. 1A such as the DTS data and pressure data that are obtained prior to or during the stimulation treatment. For example, DTS traces acquired from FIG. 1A are conditioned or otherwise adjusted. From 112, method 100 proceeds to 114.

At 114, a pre-stimulation model is built. The pre-stimulation model can include a thermal model that is created by defining completion and reservoir parameters. For example, the thermal model can be built by defining completion and reservoir sections/zones length using mobility/open-hold log data. The thermal model can receive or include reservoir parameters (for example, K, S, and section/zone length) and generate simulated DTS data and pressure data for the stimulation operation.

In some implementations, the pre-stimulation model can be built prior to the stimulation treatment in order to allow a real-time evaluation. In some implementations, the required changes (for example, a change or update of one or more of K, S, and section/zone length) are applied to match a first transient event (for example, either the cool-down or warm-back transient event) so that the prepared thermal modeling data support the entire simulation operation. As a specific example, changes of K from 20 to 22 and and S from 1.6 to 2 can be made so that the measured temperature profile from DTS sensor is the same or substantially the same as the profile obtained from simulation.

The simulated DTS and pressure data are utilized in the pre-stimulation model and adjusted until a match is achieved for use in the stimulation operation. In some implementations, a temperature transient model is used to estimate what would be a simulated temperature response as well as injection rate that corresponds to the pre-flush events (injection and warmback). An attempt is made to match three simulated thermal events (baseline, pre-flush injection, and pre-flush warmback) with actual data acquired above.

At 116, a determination is made whether a thermal match between the actual DTS and pressure data and the simulated DTS and pressure data was obtained. In some implementations, a thermal match is defined as a difference of 5% or less between the simulated and actual data.

For example, referring to FIG. 2, FIG. 2 is an illustration of an actual vs. simulated injection-warmback DTS plot 200 with baseline, according to an implementation. Specifically, curves 202, 212 and 222 are the actually DTSs during warmback and injection, whereas curves 204 and 214 the simulated DTSs during warmback and injection, respectively. Curves 222 and 224 are the baseline actual and simulated DTSs, respectively. As shown in FIG. 2, the simulated DTSs match the actual DTSs.

Figure 3:
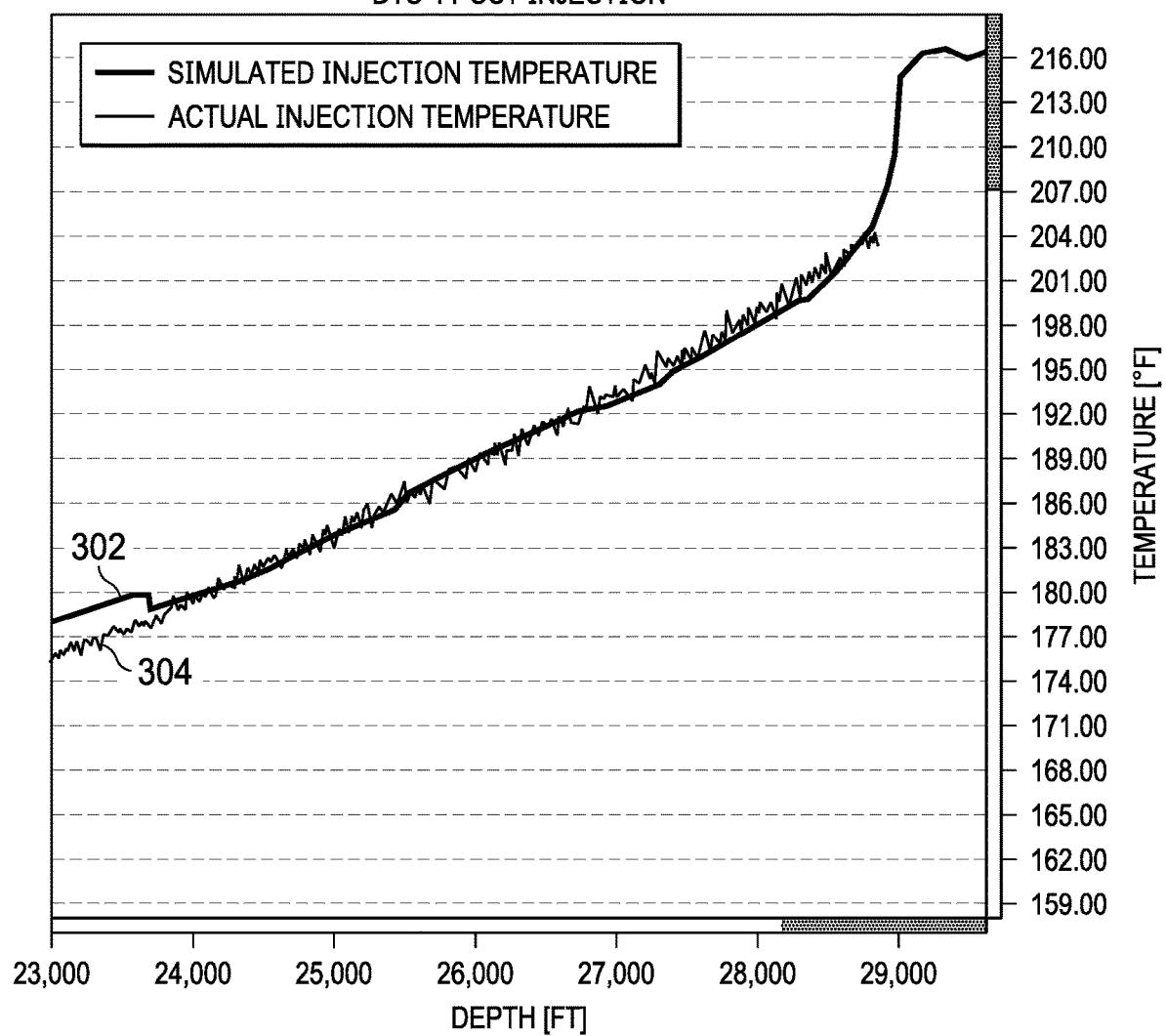
FIG. 3 is an illustration of an actual vs. simulated injection DTS plot, according to an implementation.

FIG. 3 is an illustration of a simulated vs. actual DTS injection plot 300, according to an implementation. Specifically, the curve 302 shows change of the simulated temperature whereas the curve 304 shows change of the actual temperature during injection. As shown in FIG. 3, the simulated temperature matches the actual temperature. Returning to FIG. 1B, from 114, method 100 proceeds to 116.

In response to determining that the thermal match between the actual DTS and pressure data and the simulated DTS and pressure data is not obtained, reservoir parameters (for example, K, S, and section/zone length) are adjusted for building the pre-stimulation model and method 100 proceeds back to 114. For example, the reservoir parameters (including the K and S parameters) are updated. The pre-stimulation model is updated based on the updated reservoir parameters accordingly. Based on the updated pre-stimulation model, the simulated DTS and pressure data are re-generated until the thermal match between the actual DTS and pressure data and the simulated DTS and pressure data is obtained. In response to determining that the thermal match between the actual DTS and pressure data and the simulated DTS and pressure data is obtained, method 100 proceeds to 118.

At 118, a determination is made whether the K and S parameters match a performed pressure transient analysis (PTA). PTA is a process to interpret the pressure data and interpret K and S parameters. The K and S parameters match a PTA when the K and S parameters fall within respective ranges of K and S parameters determined by the PTA. In some implementations, the PTA is performed before the first transient event. In some implementations, the PTA is performed by the pressure data attained from the pressure gauge. If NO, reservoir parameters are continued to be adjusted for building the pre-stimulation model and method 100 proceeds back to 114. For example, the reservoir parameters (including the K and S parameters) are updated. The pre-stimulation model is further updated based on the updated reservoir parameters accordingly. Based on the updated pre-stimulation model, the simulated DTS and pressure data are re-generated until the thermal match between the actual DTS and pressure data and the simulated DTS and pressure data is obtained and the updated K parameter and the updated S parameter match the PTA. In response to determining the thermal match is obtained and the K and S parameters match the PTA, method 100 proceeds to 120.

At 120, a final stage processing is performed. Required changes for zonation, formation permeability, and formation damage skin are applied to obtain a thermal match resulting in a synthetic flow profiling (a virtual PLT) before a later stimulation. Data obtained from 110 is used to repeat the PLT execution of 110 and both 112 and 114. The post-stimulation PLT data from the repeat from 110 is used to fine-tune the zonation, formation permeability, and formation damage skin values until a profile match is obtained. In some implementations, the data can be verified with the reservoir description and or records from management teams.

FIG. 4A is an illustration of an actual vs. simulated production rate plot 400a, according to an implementation. Specifically, the curve 402a shows the production rate at different depths based on the PLT, whereas the curve 404a shows the simulated production rate at different depths according to the example techniques described with respect to FIGS. 1A and 1B.

Figure 4B:
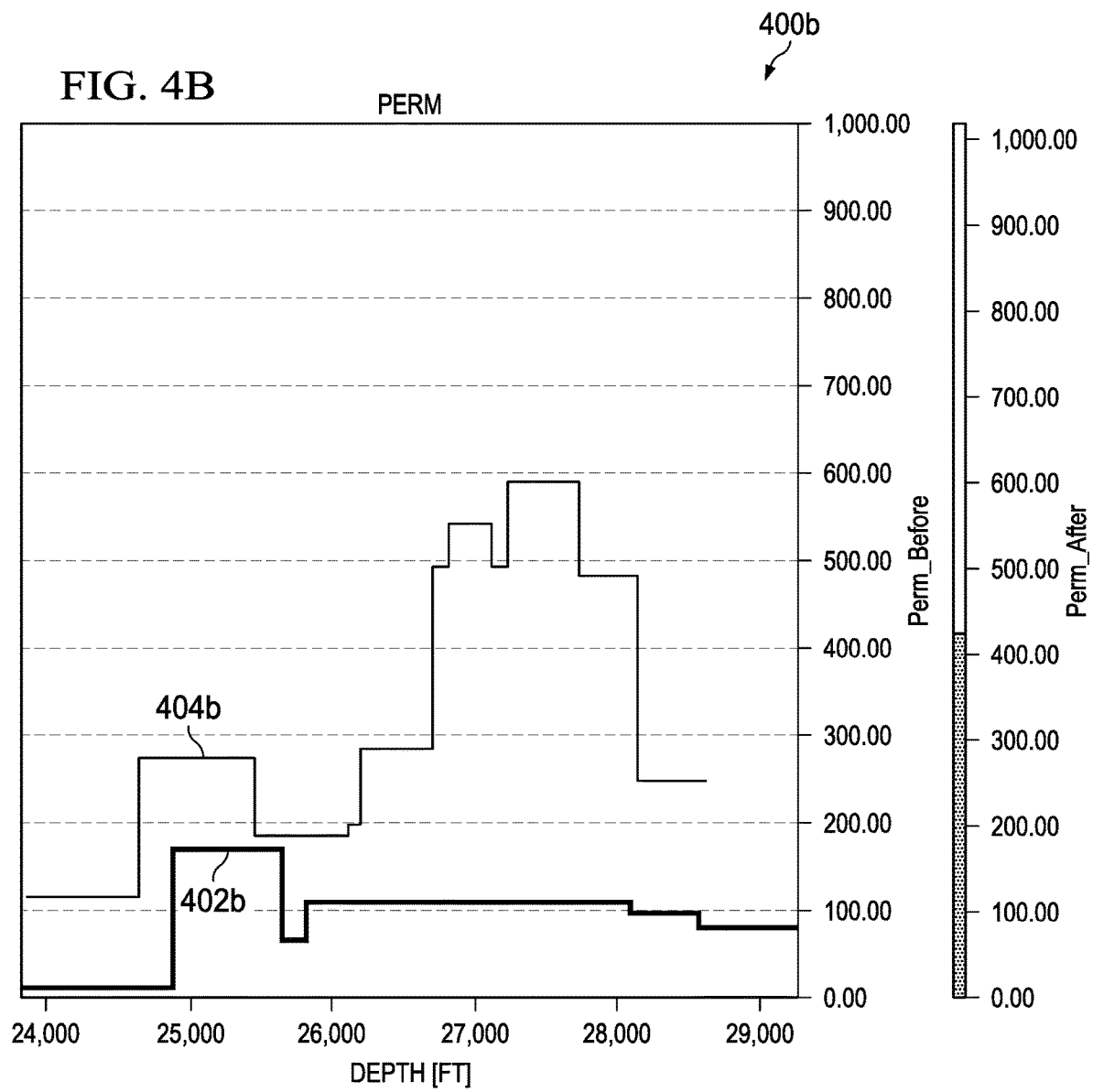
FIG. 4B is an illustration of permeability before and after stimulation treatment that is simulated (DTS driven) using a simulation model, according to an implementation.

FIG. 4B is an illustration of simulated (DTS driven) permeability of a reservoir before and after a stimulation treatment, according to an implementation. The simulated permeability is obtained using the simulation model described with respect to FIGS. 1A and 1B. Specifically, the curve 402b shows the permeability at different depths before the stimulation treatment, whereas the curve 404b shows the simulated production rate at different depths after the stimulation treatment.

Figure 5:
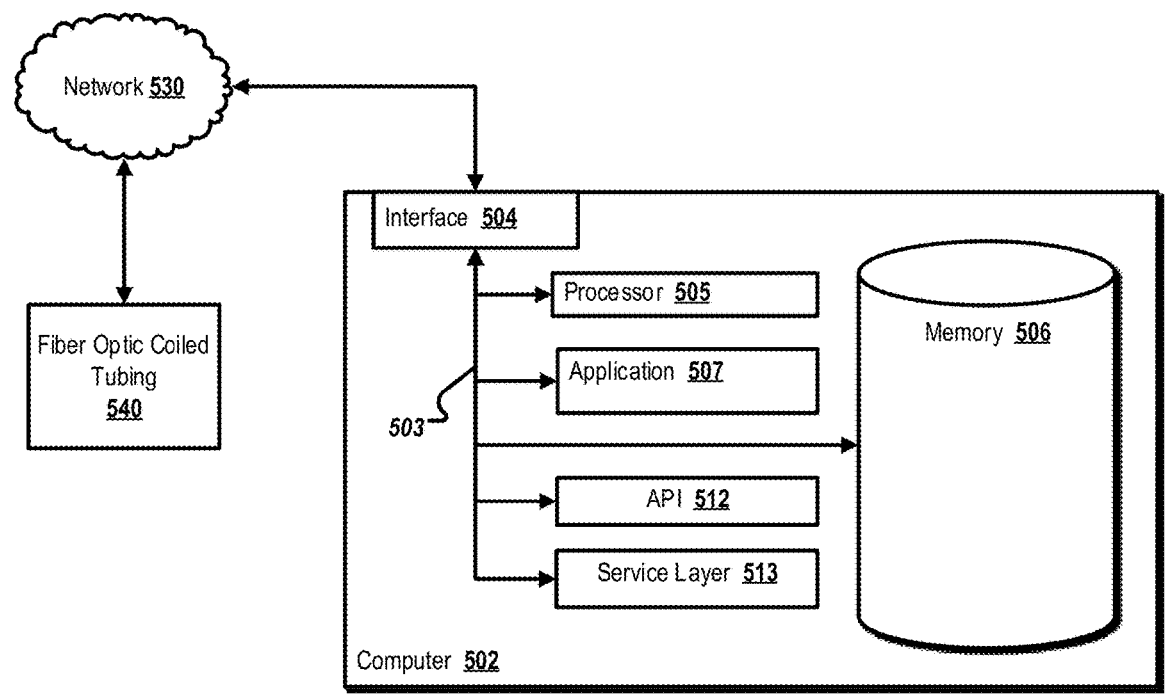
FIG. 5 is a block diagram illustrating an exemplary distributed computer system (EDCS) for performing the workflow from data acquisition to simulation.

FIG. 5 is a block diagram of an exemplary computer system 500 used to provide computational functionalities associated with described algorithms, methods, functions, processes, flows, and procedures as described in the instant disclosure, according to an implementation. The illustrated computer 502 is intended to encompass any computing device such as a server, desktop computer, laptop/notebook computer, wireless data port, smart phone, personal data assistant (PDA), tablet computing device, one or more processors within these devices, or any other suitable processing device, including both physical or virtual instances (or both) of the computing device. Additionally, the computer 502 may comprise a computer that includes an input device, such as a keypad, keyboard, touch screen, or other device that can accept user information, and an output device that conveys information associated with the operation of the computer 502, including digital data, visual, or audio information (or a combination of information), or a GUI.

The computer 502 can serve in a role as a client, network component, a server, a database or other persistency, or any other component (or a combination of roles) of a computer system for performing the subject matter described in the instant disclosure. The illustrated computer 502 is communicably coupled with a network 530. In some implementations, one or more components of the computer 502 may be configured to operate within environments, including cloud-computing-based, local, global, or other environment (or a combination of environments).

At a high level, the computer 502 is an electronic computing device operable to receive, transmit, process, store, or manage data and information associated with the described subject matter. According to some implementations, the computer 502 may also include or be communicably coupled with an application server, e-mail server, web server, caching server, streaming data server, business intelligence (BI) server, or other server (or a combination of servers).

The computer 502 can receive requests over network 530 from a client application (for example, executing on another computer 502) and responding to the received requests by processing the said requests in an appropriate software application. In addition, requests may also be sent to the computer 502 from internal users (for example, from a command console or by other appropriate access method), external or third-parties, other automated applications, as well as any other appropriate entities, individuals, systems, or computers.

Each of the components of the computer 502 can communicate using a system bus 503. In some implementations, any or all of the components of the computer 502, both hardware or software (or a combination of hardware and software), may interface with each other or the interface 504 (or a combination of both) over the system bus 503 using an application programming interface (API) 512 or a service layer 513 (or a combination of the API 512 and service layer 513). The API 512 may include specifications for routines, data structures, and object classes. The API 512 may be either computer-language independent or dependent and refer to a complete interface, a single function, or even a set of APIs. The service layer 513 provides software services to the computer 502 or other components (whether or not illustrated) that are communicably coupled to the computer 502. The functionality of the computer 502 may be accessible for all service consumers using this service layer. Software services, such as those provided by the service layer 513, provide reusable, defined business functionalities through a defined interface. For example, the interface may be software written in JAVA, C++, or other suitable language providing data in extensible markup language (XML) format or other suitable format. While illustrated as an integrated component of the computer 502, alternative implementations may illustrate the API 512 or the service layer 513 as stand-alone components in relation to other components of the computer 502 or other components (whether or not illustrated) that are communicably coupled to the computer 502. Moreover, any or all parts of the API 512 or the service layer 513 may be implemented as child or sub-modules of another software module, enterprise application, or hardware module without departing from the scope of this disclosure.

The computer 502 includes an interface 504. Although illustrated as a single interface 504 in FIG. 5, two or more interfaces 504 may be used according to particular needs, desires, or particular implementations of the computer 502. The interface 504 is used by the computer 502 for communicating with other systems in a distributed environment that are connected to the network 530 (whether illustrated or not). Generally, the interface 504 comprises logic encoded in software or hardware (or a combination of software and hardware) and operable to communicate with the network 530. More specifically, the interface 504 may comprise software supporting one or more communication protocols associated with communications such that the network 530 or interface's hardware is operable to communicate physical signals within and outside of the illustrated computer 502.

The computer 502 includes a processor 505. Although illustrated as a single processor 505 in FIG. 5, two or more processors may be used according to particular needs, desires, or particular implementations of the computer 502. Generally, the processor 505 executes instructions and manipulates data to perform the operations of the computer 502 and any algorithms, methods, functions, processes, flows, and procedures as described in the instant disclosure.

The computer 502 also includes a memory 506 that holds data for the computer 502 or other components (or a combination of both) that can be connected to the network 530 (whether illustrated or not). For example, memory 506 can be a database storing data consistent with this disclosure. Although illustrated as a single memory 506 in FIG. 5, two or more memories may be used according to particular needs, desires, or particular implementations of the computer 502 and the described functionality. While memory 506 is illustrated as an integral component of the computer 502, in alternative implementations, memory 506 can be external to the computer 502.

The application 507 is an algorithmic software engine providing functionality according to particular needs, desires, or particular implementations of the computer 502, particularly with respect to functionality described in this disclosure. For example, application 507 can serve as one or more components, modules, applications, etc. Further, although illustrated as a single application 507, the application 507 may be implemented as multiple applications 507 on the computer 502. In addition, although illustrated as integral to the computer 502, in alternative implementations, the application 507 can be external to the computer 502.

There may be any number of computers 502 associated with, or external to, a computer system containing computer 502, each computer 502 communicating over network 530. Further, the term "client," "user," and other appropriate terminology may be used interchangeably as appropriate without departing from the scope of this disclosure. Moreover, this disclosure contemplates that many users may use one computer 502, or that one user may use multiple computers 502.

Implementations of the subject matter and the functional operations described in this specification can be implemented in digital electronic circuitry, in tangibly embodied computer software or firmware, in computer hardware, including the structures disclosed in this specification and their structural equivalents, or in combinations of one or more of them. Implementations of the subject matter described in this specification can be implemented as one or more computer programs, that is, one or more modules of computer program instructions encoded on a tangible, non-transitory, computer-readable computer-storage medium for execution by, or to control the operation of, data processing apparatus. Alternatively, or additionally, the program instructions can be encoded in/on an artificially generated propagated signal, for example, a machine-generated electrical, optical, or electromagnetic signal that is generated to encode information for transmission to suitable receiver apparatus for execution by a data processing apparatus. The computer-storage medium can be a machine-readable storage device, a machine-readable storage substrate, a random or serial access memory device, or a combination of computer-storage mediums.

The term "real-time," "real time," "realtime," "real (fast) time (RFT)," "near(ly) real-time (NRT)," "quasi real-time," or similar terms (as understood by one of ordinary skill in the art), means that an action and a response are temporally proximate such that an individual perceives the action and the response occurring substantially simultaneously. For example, the time difference for a response to display (or for an initiation of a display) of data following the individual's action to access the data may be less than 1 ms, less than 1 sec., less than 5 secs., etc. While the requested data need not be displayed (or initiated for display) instantaneously, it is displayed (or initiated for display) without any intentional delay, taking into account processing limitations of a described computing system and time required to, for example, gather, accurately measure, analyze, process, store, or transmit the data.

The terms "data processing apparatus," "computer," or "electronic computer device" (or equivalent as understood by one of ordinary skill in the art) refer to data processing hardware and encompass all kinds of apparatus, devices, and machines for processing data, including by way of example, a programmable processor, a computer, or multiple processors or computers. The apparatus can also be or further include special purpose logic circuitry, for example, a central processing unit (CPU), an FPGA (field programmable gate array), or an ASIC (application-specific integrated circuit). In some implementations, the data processing apparatus or special purpose logic circuitry (or a combination of the data processing apparatus or special purpose logic circuitry) may be hardware- or software-based (or a combination of both hardware- and software-based). The apparatus can optionally include code that creates an execution environment for computer programs, for example, code that constitutes processor firmware, a protocol stack, a database management system, an operating system, or a combination of execution environments. The present disclosure contemplates the use of data processing apparatuses with or without conventional operating systems, for example LINUX, UNIX, WINDOWS, MAC OS, ANDROID, IOS, or any other suitable conventional operating system.

A computer program, which may also be referred to or described as a program, software, a software application, a module, a software module, a script, or code can be written in any form of programming language, including compiled or interpreted languages, or declarative or procedural languages, and it can be deployed in any form, including as a stand-alone program or as a module, component, subroutine, or other unit suitable for use in a computing environment. A computer program may, but need not, correspond to a file in a file system. A program can be stored in a portion of a file that holds other programs or data, for example, one or more scripts stored in a markup language document, in a single file dedicated to the program in question, or in multiple coordinated files, for example, files that store one or more modules, sub-programs, or portions of code. A computer program can be deployed to be executed on one computer or on multiple computers that are located at one site or distributed across multiple sites and interconnected by a communication network. While portions of the programs illustrated in the various figures are shown as individual modules that implement the various features and functionality through various objects, methods, or other processes, the programs may instead include a number of sub-modules, third-party services, components, libraries, and such, as appropriate. Conversely, the features and functionality of various components can be combined into single components as appropriate. Thresholds used to make computational determinations can be statically, dynamically, or both statically and dynamically determined.

The methods, processes, logic flows, etc. described in this specification can be performed by one or more programmable computers executing one or more computer programs to perform functions by operating on input data and generating output. The methods, processes, logic flows, etc. can also be performed by, and apparatus can also be implemented as, special purpose logic circuitry, for example, a CPU, an FPGA, or an ASIC.

Computers suitable for the execution of a computer program can be based on general or special purpose microprocessors, both, or any other kind of CPU. Generally, a CPU will receive instructions and data from a read-only memory (ROM) or a random access memory (RAM), or both. The essential elements of a computer are a CPU, for performing or executing instructions, and one or more memory devices for storing instructions and data. Generally, a computer will also include, or be operatively coupled to, receive data from or transfer data to, or both, one or more mass storage devices for storing data, for example, magnetic, magneto-optical disks, or optical disks. However, a computer need not have such devices. Moreover, a computer can be embedded in another device, for example, a mobile telephone, a personal digital assistant (PDA), a mobile audio or video player, a game console, a global positioning system (GPS) receiver, or a portable storage device, for example, a universal serial bus (USB) flash drive, to name just a few.

Computer-readable media (transitory or non-transitory, as appropriate) suitable for storing computer program instructions and data include all forms of non-volatile memory, media and memory devices, including by way of example semiconductor memory devices, for example, erasable programmable read-only memory (EPROM), electrically erasable programmable read-only memory (EEPROM), and flash memory devices; magnetic disks, for example, internal hard disks or removable disks; magneto-optical disks; and CD-ROM, DVD+/-R, DVD-RAM, and DVD-ROM disks. The memory may store various objects or data, including caches, classes, frameworks, applications, backup data, jobs, web pages, web page templates, database tables, repositories storing dynamic information, and any other appropriate information including any parameters, variables, algorithms, instructions, rules, constraints, or references thereto. Additionally, the memory may include any other appropriate data, such as logs, policies, security or access data, reporting files, as well as others. The processor and the memory can be supplemented by, or incorporated in, special purpose logic circuitry.

To provide for interaction with a user, implementations of the subject matter described in this specification can be implemented on a computer having a display device, for example, a CRT (cathode ray tube), LCD (liquid crystal display), LED (Light Emitting Diode), or plasma monitor, for displaying information to the user and a keyboard and a pointing device, for example, a mouse, trackball, or trackpad by which the user can provide input to the computer. Input may also be provided to the computer using a touchscreen, such as a tablet computer surface with pressure sensitivity, a multi-touch screen using capacitive or electric sensing, or other type of touchscreen. Other kinds of devices can be used to provide for interaction with a user as well; for example, feedback provided to the user can be any form of sensory feedback, for example, visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

The term "graphical user interface," or "GUI," may be used in the singular or the plural to describe one or more graphical user interfaces and each of the displays of a particular graphical user interface. Therefore, a GUI may represent any graphical user interface, including but not limited to, a web browser, a touch screen, or a command line interface (CLI) that processes information and efficiently presents the information results to the user. In general, a GUI may include a plurality of user interface (UI) elements, some or all associated with a web browser, such as interactive fields, pull-down lists, and buttons. These and other UI elements may be related to or represent the functions of the web browser.

Implementations of the subject matter described in this specification can be implemented in a computing system that includes a back-end component, for example, as a data server, or that includes a middleware component, for example, an application server, or that includes a front-end component, for example, a client computer having a graphical user interface or a Web browser through which a user can interact with an implementation of the subject matter described in this specification, or any combination of one or more such back-end, middleware, or front-end components. The components of the system can be interconnected by any form or medium of wireline or wireless digital data communication (or a combination of data communication), for example, a communication network. Examples of communication networks include a local area network (LAN), a radio access network (RAN), a metropolitan area network (MAN), a wide area network (WAN), Worldwide Interoperability for Microwave Access (WIMAX), a wireless local area network (WLAN) using, for example, 802.11 a/b/g/n or 802.20 (or a combination of 802.11x and 802.20 or other protocols consistent with this disclosure), all or a portion of the Internet, or any other communication system or systems at one or more locations (or a combination of communication networks). The network may communicate with, for example, Internet Protocol (IP) packets, Frame Relay frames, Asynchronous Transfer Mode (ATM) cells, voice, video, data, or other suitable information (or a combination of communication types) between network addresses.

The computing system can include clients and servers. A client and server are generally remote from each other and typically interact through a communication network. The relationship of client and server arises by virtue of computer programs running on the respective computers and having a client-server relationship to each other.

While this specification contains many specific implementation details, these should not be construed as limitations on the scope of any invention or on the scope of what may be claimed, but rather as descriptions of features that may be specific to particular implementations of particular inventions. Certain features that are described in this specification in the context of separate implementations can also be implemented, in combination, in a single implementation. Conversely, various features that are described in the context of a single implementation can also be implemented in multiple implementations, separately, or in any suitable sub-combination. Moreover, although features may be described above as acting in certain combinations and even initially claimed as such, one or more features from a claimed combination can, in some cases, be excised from the combination, and the claimed combination may be directed to a sub-combination or variation of a sub-combination.

Particular implementations of the subject matter have been described. Other implementations, alterations, and permutations of the described implementations are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional), to achieve desirable results. In certain circumstances, multitasking or parallel processing (or a combination of multitasking and parallel processing) may be advantageous and performed as deemed appropriate.

Moreover, the separation or integration of various system modules and components in the implementations described above should not be understood as requiring such separation or integration in all implementations, and it should be understood that the described program components and systems can generally be integrated together in a single software product or packaged into multiple software products.

Accordingly, the above description of example implementations does not define or constrain this disclosure. Other changes, substitutions, and alterations are also possible without departing from the spirit and scope of this disclosure.

Furthermore, any claimed implementation below is considered to be applicable to at least a computer-implemented method; a non-transitory, computer-readable medium storing computer-readable instructions to perform the computer-implemented method; and a computer system comprising a computer memory interoperably coupled with a hardware processor configured to perform the computer-implemented method or the instructions computer-readable medium.

What is claimed is:

1. A computer-implemented method, comprising:
   receiving actual distributed temperature sensing (DTS) data and pressure data in response to a stimulation treatment applied to a hydrocarbon field through a well in the hydrocarbon field;
   building a pre-stimulation model that includes reservoir parameters, the pre-stimulation model generating simulated DTS and pressure data as a function of the reservoir parameters, the reservoir parameters comprising a permeability parameter and a skin parameter of the hydrocarbon field;
   determining whether a thermal match between the actual DTS and pressure data and the simulated DTS and pressure data is obtained;
   in response to determining that the thermal match between the actual DTS and pressure data and the simulated DTS and pressure data is not obtained:
   updating the reservoir parameters, wherein updating the reservoir parameters comprises updating the permeability parameter and the skin parameter;
   updating the pre-stimulation model based on the updated reservoir parameters; and
   re-generating the simulated DTS and pressure data based on the updated pre-stimulation model until the thermal match between the actual DTS and pressure data and the simulated DTS and pressure data is obtained;
   determining whether the updated permeability parameter and the updated skin parameter match a performed pressure transient analysis (PTA); and
   in response to determining that the updated permeability parameter and the updated skin parameter do not match the PTA:
   updating the reservoir parameters, wherein updating the reservoir parameters comprises the updated permeability parameter and the updated skin parameter;
   updating the pre-stimulation model based on the updated reservoir parameters; and
   re-generating the simulated DTS and pressure data based on the updated pre-stimulation model until the thermal match between the actual DTS and pressure data and the simulated DTS and pressure data is obtained and the updated permeability parameter and the updated skin parameter match the PTA.

2. The computer-implemented method of claim 1, further comprising:
   receiving input well data associated with the stimulation treatment for the hydrocarbon field through the well in the hydrocarbon field; and
   preparing the stimulation treatment based on input well data, wherein preparing the stimulation treatment of the hydrocarbon field comprises one or more of:
   designing a coiled tubing stimulation;
   testing the well infectivity;
   monitoring movement of injected fluid in the well;
   creating a pressure transient event to be analyzed for the permeability parameter and the skin parameter; or
   monitoring a warmback profile of the hydrocarbon field.

3. The computer-implemented method of claim 2, wherein preparing a stimulation treatment of the hydrocarbon field comprises obtaining pre-stimulation DTS data and pressure data associated with the well in the hydrocarbon field, the method further comprising:

determining whether the obtained pre-stimulation DTS data and pressure data are sufficient for executing the stimulation treatment; and in response to determining that the obtained pre-stimulation DTS data and pressure data not sufficient for executing the stimulation treatment, obtaining more pre-stimulation DTS and pressure data by creating more events in the preparing the stimulation treatment.

4. The computer-implemented method of claim 3, further comprising, in response to determining that the obtained pre-stimulation DTS data and pressure data are sufficient for executing the stimulation treatment, performing the stimulation treatment.

5. The computer-implemented method of claim 4, wherein performing the stimulation treatment comprises one or more of:

detecting high intake zones of the well based on the pre-stimulation DTS data;

optimizing stimulation fluid pumping schedule by adjusting a flow rate to match an actual well condition; or pumping stimulation fluid into the well according to a stimulation fluid pumping schedule.

6. The computer-implemented method of claim 2, wherein the input well data comprises one or more of a wellbore diagram, directional survey, while-drilling mobility data, processed lithological data or petro-physical logs.

7. The computer-implemented method of claim 1, further comprising evaluating the stimulation treatment, wherein evaluating the stimulation treatment comprises one or more of:

obtaining actual DTS data while injecting a post-flush fluid into the well;

comparing an injection/fall-off of a pre-flush into the well with an injection/fall-off of the post-flush into the well to evaluate chemical diversion and stimulation efficiency;

detecting improvements in flow paths or pressure response; or performing a production logging tool (PLT) run.

8. The computer-implemented method of claim 1, wherein building a pre-stimulation model comprises one or more of:

applying a change of the reservoir parameters to match a transient event; or building the pre-stimulation model to match a thermal event.

9. The computer-implemented method of claim 1, further comprising fine-tuning the actual DTS and pressure data and the simulated DTS and pressure data for building the pre-stimulation model.

10. The computer-implemented method of claim 1, further comprising:

comparing the reservoir parameters with a result of a production logging tool (PLT) run; or outputting the reservoir parameters.

11. A non-transitory computer-readable medium storing instructions executable by a computer system to perform operations comprising:

receiving actual distributed temperature sensing (DTS) data and pressure data in response to a stimulation treatment applied to a hydrocarbon field through a well in the hydrocarbon field;

building a pre-stimulation model that includes reservoir parameters, the pre-stimulation model generating simulated DTS and pressure data as a function of the reservoir parameters, the reservoir parameters comprising a permeability parameter and a skin parameter of the hydrocarbon field;

determining whether a thermal match between the actual DTS and pressure data and the simulated DTS and pressure data is obtained;

in response to determining that the thermal match between the actual DTS and pressure data and the simulated DTS and pressure data is not obtained:

updating the reservoir parameters, wherein updating the reservoir parameters comprises updating the permeability parameter and the skin parameter;

updating the pre-stimulation model based on the updated reservoir parameters; and re-generating the simulated DTS and pressure data based on the updated pre-stimulation model until the thermal match between the actual DTS and pressure data and the simulated DTS and pressure data is obtained;

determining whether the updated permeability parameter and the updated skin parameter match a performed pressure transient analysis (PTA); and in response to determining that the updated permeability parameter and the updated skin parameter do not match the PTA:

updating the reservoir parameters, wherein updating the reservoir parameters comprises the updated permeability parameter and the updated skin parameter;

updating the pre-stimulation model based on the updated reservoir parameters; and re-generating the simulated DTS and pressure data based on the updated pre-stimulation model until the thermal match between the actual DTS and pressure data and the simulated DTS and pressure data is obtained and the updated permeability parameter and the updated skin parameter match the PTA.

12. The non-transitory computer-readable medium of claim 11, wherein the operations further comprises:

receiving input well data associated with the stimulation treatment for the hydrocarbon field through the well in the hydrocarbon field; and preparing the stimulation treatment based on input well data, wherein preparing the stimulation treatment of the hydrocarbon field comprises one or more of:

designing a coiled tubing stimulation;

testing the well infectivity;

monitoring movement of injected fluid in the well;

creating a pressure transient event to be analyzed for the permeability parameter and the skin parameter; or monitoring a warmback profile of the hydrocarbon field.

13. The non-transitory computer-readable medium of claim 12, wherein preparing a stimulation treatment of the hydrocarbon field comprises obtaining pre-stimulation DTS data and pressure data associated with the well in the hydrocarbon field, the opeations further comprising:

determining whether the obtained pre-stimulation DTS data and pressure data are sufficient for executing the stimulation treatment; and in response to determining that the obtained pre-stimulation DTS data and pressure data not sufficient for executing the stimulation treatment, obtaining more pre-stimulation DTS and pressure data by creating more events in the preparing the stimulation treatment.

14. The non-transitory computer-readable medium of claim 11, wherein the operations further comprises evaluating the stimulation treatment, wherein evaluating the stimulation treatment comprises one or more of:

obtaining actual DTS data while injecting a post-flush fluid into the well;
comparing an injection/fall-off of a pre-flush into the well with an injection/fall-off of the post-flush into the well to evaluate chemical diversion and stimulation efficiency;
detecting improvements in flow paths or pressure response; or
performing a production logging tool (PLT) run.

15. The non-transitory computer-readable medium of claim 11, wherein building a pre-stimulation model comprises one or more of:
applying a change of the reservoir parameters to match a transient event; or
building the pre-stimulation model to match a thermal event.

16. A computer-implemented system comprising:
memory; and
data processing apparatus operable to:
receive actual distributed temperature sensing (DTS) data and pressure data in response to a stimulation treatment applied to a hydrocarbon field through a well in the hydrocarbon field;
build a pre-stimulation model that includes reservoir parameters, the pre-stimulation model generating simulated DTS and pressure data as a function of the reservoir parameters, the reservoir parameters comprising a permeability parameter and a skin parameter of the hydrocarbon field;
determine whether a thermal match between the actual DTS and pressure data and the simulated DTS and pressure data is obtained;
in response to determining that the thermal match between the actual DTS and pressure data and the simulated DTS and pressure data is not obtained:
update the reservoir parameters, wherein updating the reservoir parameters comprises updating the permeability parameter and the skin parameter;
update the pre-stimulation model based on the updated reservoir parameters; and
re-generate the simulated DTS and pressure data based on the updated pre-stimulation model until the thermal match between the actual DTS and pressure data and the simulated DTS and pressure data is obtained;
determine whether the updated permeability parameter and the updated skin parameter match a performed pressure transient analysis (PTA); and
in response to determining that the updated permeability parameter and the updated skin parameter do not match the PTA:
update the reservoir parameters, wherein updating the reservoir parameters comprises the updated permeability parameter and the updated skin parameter;
update the pre-stimulation model based on the updated reservoir parameters; and
re-generate the simulated DTS and pressure data based on the updated pre-stimulation model until the thermal match between the actual DTS and pressure data and the simulated DTS and pressure data is obtained and the updated permeability parameter and the updated skin parameter match the PTA.

17. The computer-implemented system of claim 16, the data processing apparatus further operable to:
receive input well data associated with the stimulation treatment for the hydrocarbon field through the well in the hydrocarbon field; and
prepare the stimulation treatment based on input well data, wherein preparing the stimulation treatment of the hydrocarbon field comprises one or more of:
designing a coiled tubing stimulation;
testing the well infectivity;
monitoring movement of injected fluid in the well;
creating a pressure transient event to be analyzed for the permeability parameter and the skin parameter; or
monitor a warmback profile of the hydrocarbon field.

18. The computer-implemented system of claim 16, the data processing apparatus further operable to:
obtain actual DTS data while injecting a post-flush fluid into the well;
compare an injection/fall-off of a pre-flush into the well with an injection/fall-off of the post-flush into the well to evaluate chemical diversion and stimulation efficiency;
detect improvements in flow paths or pressure response; or
perform a production logging tool (PLT) run.

19. The computer-implemented system of claim 16, the data processing apparatus further operable to fine-tune the actual DTS and pressure data and the simulated DTS and pressure data for building the pre-stimulation model.

20. The computer-implemented system of claim 16, the data processing apparatus further operable to:
compare the reservoir parameters with a result of a production logging tool (PLT) run; or
output the reservoir parameters.

* * * * *